United States Patent
Wendt et al.

(10) Patent No.: US 7,724,046 B2
(45) Date of Patent: May 25, 2010

(54) HIGH SIDE/LOW SIDE DRIVER DEVICE FOR SWITCHING ELECTRICAL LOADS

(75) Inventors: Michael Wendt, Wasserburg (DE); Lenz Thoma, Munich (DE); Bernhard Wicht, Munich (DE)

(73) Assignee: Texas InstrumentsDeutschland GmbH, Freising (DE)

( * ) Notice: Subject to any disclaimer, the term of this patent is extended or adjusted under 35 U.S.C. 154(b) by 51 days.

(21) Appl. No.: 11/752,296

(22) Filed: May 22, 2007

(65) Prior Publication Data

US 2007/0290738 A1 Dec. 20, 2007

Related U.S. Application Data

(60) Provisional application No. 60/882,462, filed on Dec. 28, 2006.

(51) Int. Cl.
*H03B 1/00* (2006.01)
(52) U.S. Cl. ............................................ 327/110
(58) Field of Classification Search ................. 327/110
See application file for complete search history.

(56) References Cited

U.S. PATENT DOCUMENTS

| 5,757,213 | A  | * | 5/1998  | Moller          | 327/108 |
| 5,828,247 | A  | * | 10/1998 | Moller et al.   | 327/110 |
| 5,969,964 | A  | * | 10/1999 | Mangtani        | 363/132 |
| 6,348,820 | B1 | * | 2/2002  | Bennett et al.  | 327/110 |
| 2004/0227547 | A1 | * | 11/2004 | Shiraishi et al. | 327/110 |

* cited by examiner

*Primary Examiner*—Lincoln Donovan
*Assistant Examiner*—William Hernandez
(74) *Attorney, Agent, or Firm*—William B. Kempler; Wade J. Brady, III; Frederick J. Telecky, Jr.

(57) ABSTRACT

An integrated circuit device for switching electrical loads that have an inductive component comprises at least one switching channel that includes a power stage with a power MOS transistor and a driver circuit for driving the gate of the power MOS transistor, the switching stage being configurable for use in either of a High Side configuration and a Low Side configuration.

11 Claims, 5 Drawing Sheets

HIGH SIDE/LOW SIDE DRIVER DEVICE FOR SWITCHING ELECTRICAL LOADS

CROSS-REFERENCE TO RELATED APPLICATIONS

This application claims priority under 35 USC 119, 120 to German Patent Application No. 10 2006 024 002.2 filed May 22, 2006; German Patent Application No. DE 10 2007 002 377.6 filed Jan. 16, 2007; and to U.S. Provisional Application No. 60/882,462 filed Dec. 28, 2006.

FILED OF THE INVENTION

The invention relates to an integrated circuit device having a switching stage for controlling electrical components in motor vehicles or the like; and, in particular, to such device able to be configured for use as either a high side driver or a low side driver.

BACKGROUND

Figures 1, 2, 3:
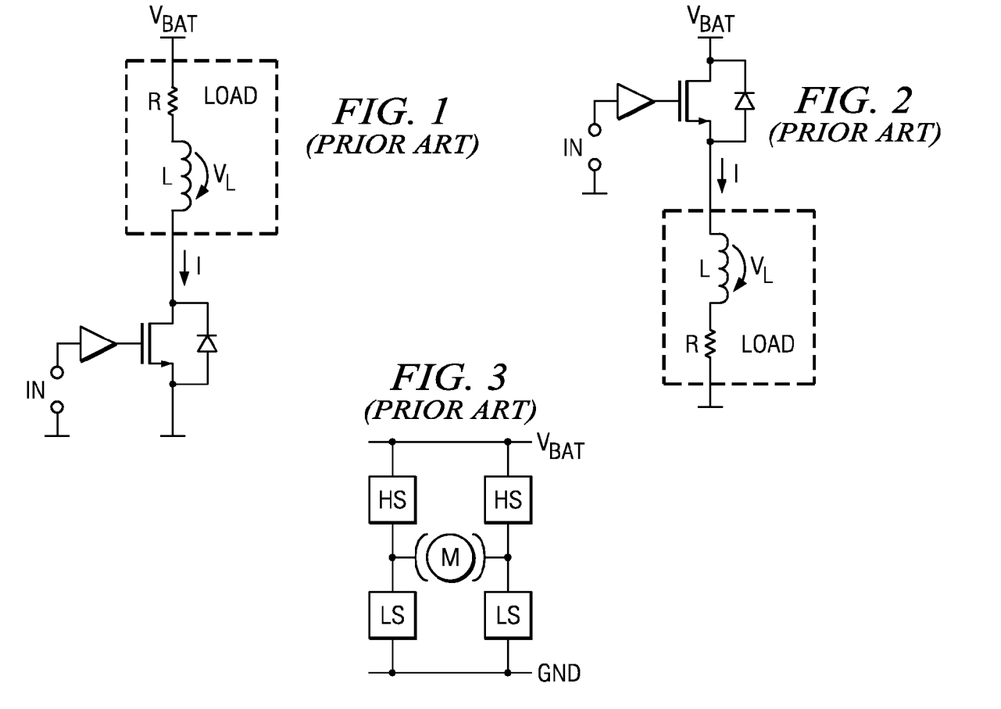
FIG. 1 is a circuit diagram of a low-side driver.
FIG. 2 is a circuit diagram of a high-side driver.
FIG. 3 is a schematic diagram of an H-bridge configuration with HSD and LSD.

Whenever electrical or electromechanical devices like valves, motors, heaters or lamps have to be switched on or off, a driver and a switch are needed to convert a digital signal (e.g., an output signal of a microcontroller) into a current flowing through the load. Two widespread possibilities are in use—the high-side driver, as shown in FIG. 2, and the low-side driver, as shown in FIG. 1 (both explained in detail later). Both possibilities use the same components, but are different in the way they are protected and need different supply voltages. Sometimes both drivers are needed in one application, as in H-bridge motor drivers (a schematic diagram of which is shown in FIG. 3), but often just one kind of driver is needed. Which one is preferred depends on the application and on individual design strategies. Normally the customer decides which option is used; however, this decision leads to some disadvantages. From the moment one kind of driver is ordered, the customer is locked into either a high-side or a low-side driver. If changes occur within the project that would lead to a change in decision, it can be expensive for the customer to have to place a new order for drivers of the other kind. Also, if the customer has a similar project, but one which uses different drivers, a new order has to be placed and the design has to be changed. The manufacturer has to provide the two different drivers, which leads to twice the development effort, twice the production and twice the storing costs. If, however, it could be made possible to provide a product which works, not only as a high-side driver, but also as a low-side driver, these doubled costs could be reduced, leading to a less expensive product. The customer would have the advantage of cost reductions and greater flexibility in the use of the product.

SUMMARY

In one aspect, the invention provides an integrated configurable high-side/low-side driver, which can be used either as high-side driver or as low side-driver. The external wiring of the load determines which option is in use. In example embodiments, this configurable driver is implemented as an integrated circuit chip.

From the high-side and low-side drivers, it is known that both need a special protection to avoid destruction during operation, but also protection against wrong handling. This includes protection against electrostatic discharge (ESD) as well as short circuits. Thus, in preferred embodiments, a protection which works for both cases is implemented. A new protection which allows a faster switch off of the transistor is also implemented. Therefore, it has to be possible to work with voltages below substrate voltage at certain nodes. The chip is able to drive loads with a high inductive component.

This chip is envisioned to be especially useful for automotive applications; thus, it should be able to work within the operating regions which are normal for those applications. All parts are preferably implemented in a modular way. The process technology selected for example embodiments of the chip is a BCD process, which provides bipolar, CMOS and drain extended MOS devices. Some of the nodes drop to voltages below the substrate voltage during normal operation. The configurable driver should preferably not be destroyed by these conditions or affect other electronic components.

BRIEF DESCRIPTION OF THE DRAWINGS

Example embodiments of the invention are described with reference to accompanying drawings, wherein.

DETAILED DESCRIPTION OF EMBODIMENTS

High voltages and high currents occur in automotive applications leading to problems in electromagnetic compatibility (EMC), as crosstalk between components might affect their function. To reduce these effects, voltage and current slopes are preferably controlled. Also, special needs are required in electrostatic discharge (ESD) protection.

For example implementations, the components preferably have to withstand even higher voltages than mentioned before due to the so-called "load dump" that occurs when the battery is suddenly disconnected while the alternator is generating. The peak voltage in this case ranges between 25V and 125V and may last from 200 ms up to 400 ms. Devices that are able to withstand 125V are difficult to build and require a large die area, both leading to cost increase. To avoid this, an external protection is used in most cars to limit the voltage in the case of a load dump to 40V. Most electronic components work with switching times much shorter than this. Valves, motors and other components are turned on or off within a few microseconds. Thus, the load dump voltage is seen as a DC voltage under which safety relevant and other car systems still have to work.

In a car some of the loads have a high inductive component. For example, the long wires from the battery to the load represent some inductivity, but also electric valves or motors. If loads with an inductive component are switched off fast, there are high voltage drops above these components that could destroy one or more devices. Therefore, special protection is preferably provided. Inductive loads can also lead to negative voltages at pins. Negative voltages above a certain amplitude have to be avoided. They lead to substrate currents, exceeding of voltage ratings of components, additional losses or latch-up effects. The exact tolerable amplitude of such negative voltages depends on several criteria like the connection of the pin to an n-well and breakthrough voltage of the device.

To switch electrical loads, several possible devices, like thyristors, field-effect transistor (FETs) or bipolar junction transistors (BJTs) are available. FETs have the advantage, compared to BJTs, that the control doesn't require a constant current due to the isolated gate and have higher switching frequencies than BJTs. However the normal MOSFET has a channel resistance and low breakthrough voltages which are a disadvantage in high voltage applications. Exceeding the breakthrough voltage leads to a thermal breakdown of the device and to the destruction. Automotive applications are supplied by battery and high voltages can occur during operation. A higher channel resistance therefore causes high losses during normal operation and have to be avoided.

To improve the breakthrough voltage some special MOS devices, like DMOS, IGBT or CooIMOS, were developed that have a special drift region to allow a wider space charge region and thus have a higher breakthrough voltage. In practice the DMOS has shown that it combines the advantages of a high breakthrough voltage and a low channel resistance. The DMOS is a high voltage device with a double diffused channel region and an extended drift region of an n-type doped epitaxial layer on a p-type substrate.

The n-well of the DMOS transistor and the p-type substrate form a pn-junction. To avoid currents being injected into the substrate, this diode may not be forward biased. Therefore the applied voltage at the drain contact may not be lower than the negative threshold voltage of this diode which is approximately 0.7V. Note that the source and the gate voltage may become negative, without causing any currents flowing into the substrate, as long as the drain voltage is positive or zero. However the source voltage may not be indefinitely negative as the pn-junction between source and drain will break through eventually.

The extended drift region allows a wide depletion region and thus a high breakthrough voltage. This breakthrough voltage is limited by avalanche breakdown. Maximum voltages of several 100V can be achieved by these transistors. To switch high voltages and high currents, the on-resistance is an important parameter of the DMOS. For a given maximum voltage requirement, an optimum on-resistance can be chosen by changing the epitaxial layer thickness, doping (Nd) and substrate doping (Nsub). To achieve a very low on-resistance a huge transistor width will be needed. To achieve that, the ratio W/L. has to be increased, e.g., by placing many transistors in parallel. However, this could lead to a challenge. If, due to bad connections, some transistors conduct more current than others, they could heat up to a level at which these single transistors are destroyed due to thermal breakdown. But with rising temperature, the current becomes smaller in an FET leading to less temperature increase. A smaller current at the same voltage represents a higher resistance. Thus, the current will also flow to the worse connected transistors. This way, it is possible to switch many transistors in parallel without exceeding the maximum allowed current density of single transistors. Thereby an on-resistance of under 1 can be achieved. Another advantage of DMOS transistors is that they can switch with a high frequency (typically between 20 MHz and 50 MHz). Thus, the DMOS enables fast switching with minimum power losses.

In summary, the DMOS transistor provides a fast switch that can withstand high voltages and switches nearly without power losses.

Because of the 40V load dump condition, a DMOS was chosen with a maximum drain to source voltage of 50V. As switching without power losses within the DMOS should be achieved, the on-resistance has to be very low. Therefore the width of the DMOS was chosen large compared to the channel length. Many of such DMOS transistors were placed in parallel. This way, an on-resistance of for example 350 mΩ was achieved.

High-Side and Low-Side Drivers

To control electrical loads, like lamps, valves or motors, the current through that load has to be switched on or off. Due to the high breakthrough voltage, fast switching times and the low channel resistance, the DMOS is the preferred switching transistor in automotive ASICs. Two constellations exist for a series connection of a load and a transistor. These are called High-Side Driver (HSD) and Low-Side Driver (LSD). In the following sections both drivers will be introduced. Their electrical characteristics and both circuit configurations will be investigated. Further the challenges of the drivers will be shown, Low-Side Driver (LSD)

The Low-Side Driver comprises three parts: First, the load which is connected on one side to the supply voltage (the battery voltage VBAT for automotive applications). Second, the switching transistor which is connected between the load and the ground voltage GND. Third, a driving circuit which converts a logical input signal, e.g., from a microcontroller to an appropriate voltage level to drive the gate of the transistor.

In FIG. 1, a typical Low-Side Driver is shown with a DMOS as switching transistor and a load which is modeled as a resistor and an inductance in series. This load is a typical load as in automotive applications few purely resistive loads exist. Due to the long wires or due to the kind of loads like motors and valves loads usually have inductive components, too. When the logical input is zero, the gate of the DMOS is connected to GND and the transistor is turned off ($V_{GS}=0$). No current is flowing through the transistor, thus now current is flowing through the load and it is switched off. If the logical input is high, the driving circuit converts this high signal to a gate voltage which turns the transistor on. Current is now flowing and the load is switched on. To assure proper operation of the load nearly the complete battery voltage has to be applied across it. Therefore a minimum voltage drop over the transistor is required. That is the reason why the low $R_{DS}$on of the DMOS is so important.

A DMOS has very fast switching times, yet the load cannot be switched on immediately when an inductive load is applied. As to V=L·dI/dt at the beginning of the switching the complete battery voltage will drop over the inductance and not over the resistance. Only after a short period of time which is depending on both the inductivity L and the resistance R current will flow constantly and all the voltage will drop over the resistance (when the drop over the transistor is neglected, i.e., R>>$R_{DS}$on).

When the gate voltage rises above the threshold voltage VTR, current starts to flow and is increasing slowly. As required the voltage drop over the transistor is negligible. So the drain voltage is nearly equal to ground level (0V). To turn off the transistor the gate voltage has to be switched off which can be done within microseconds. But then the current is switched off suddenly and there will be a voltage drop across the inductive load.

The energy saved in the inductance keeps IDs flowing at first, so that R·I≈$V_{BAT}$. As the current is turned off from, for example, 1A to zero, the current change results in dI≈−1A. With dt≈10 us, the drain voltage will rise theoretically to 500V. The drain voltage will rise instantly above the maximum allowed drain-source voltage when the LSD is switched off. This behavior has to be avoided.

The cause for all this is the high inductance. Inductive loads of several mH can occur in applications. The circuit has to work under a wide range of operating conditions. The implementation of a LSD therefore needs additional components which protect the circuit. However this protection should allow high drain voltages, as long as the maximum voltage ratings of the LDMOS transistor are not exceeded.

To switch off the transistor faster, the drain voltage should preferably be as high as possible.

High-Side Driver (HSD)

The High-Side Driver (HSD) comprises the same basic three parts as the LSD. Also, for this configuration, the DMOS as a n-channel device is used. Using a PMOS transistor would increase the size of the transistor for the same voltages and currents at least by a factor of 2.5. In addition, similar switching times of LSD and HSD are desired. Thus the same transistor is used. For the HSD, the drain of the switching transistor is connected to the supply voltage and the load is put between the source and GND, as shown in FIG. 2. The driving circuit is connected to the gate and converts the digital turn-on signal into an appropriate gate voltage.

When $V_{GS} \geq V_{Th}$, the transistor opens and a current flows through the load. As an NMOS is used, a low $R_{DS}$on is achieved when the applied gate voltage is at least one threshold voltage higher than the supply voltage.

To be used as a switch the transistor has to be in saturation. When the transistor is turned on, there is nearly no voltage drop across it. So the source terminal will be almost at supply voltage. To keep the transistor switched on, $V_{GS}$ has to remain at least one threshold voltage above the supply voltage. This can be achieved by supplying the driving circuit with a voltage higher than the supply voltage of the rest of the circuit. This higher voltage can be generated, e.g., by a charge pump. Switching the high-side transistor off is challenging in this case.

When the transistor is switched off, there will be a voltage drop over the inductivity. The source potential becomes negative, as the voltage drop across the inductance is negative. Due to fast switching this voltage across the inductance can be high enough to destroy the transistor. However, the HSD has a self-protection mechanism: When $V_G$ is zero, and $V_S$ becomes negative, the gate-source voltage will rise above the threshold voltage $V_{Th}$ eventually. The transistor turns on again and the energy saved in the inductance gets reduced by the drain current without the transistor being destroyed.

Depending on the driving circuit it can happen that the gate node is floating after switch off. Then the gate will become negative, too, due to the capacitive coupling between source and gate. The transistor stays in an operating point in which the current gets reduced slowly to zero. But how is the operating point determined and how far are source and gate falling below GND?

To answer these question a basic understanding of what happens is necessary. The current is slowly reduced, however the gate and source voltages are becoming more and more negative. During this time $V_{GS}$ is getting smaller, as the current gets smaller and the transistor does not need to provide such a high current. Directly after the switch-off (this point of time will be called $t_1$) the gate voltage is still zero and the source voltage is dropping to negative voltages. This is called the initial gate-source voltage, but as the gate is still zero it is equal to $V_S(t_1)$.

It is important for the switching behaviour how far the gate and especially the source voltage are dropping to negative voltages. To assure that the transistor is switched off properly, a resistor of high resistance (for example $R_{GS}$=500 kΩ is inserted between gate and source. However, the dropping of gate and source to negative values is causing a capacitive current over the gate-drain capacitance.

Due to Kirchhoff's current law, this current and the current through the gate-source resistance have to be the same, as all other currents onto the gate node are negligible (the driving circuit which is connected to the gate is designed to leave the gate node floating and therefore does not conduct any current).

When this energy is dissipated, the current becomes zero and the transistor will be switched off. During this time t the inductance causes a voltage drop. As the current is turned off, this leads to a negative voltage drop across the inductance. Thus the source voltage is negative, too. During switch off all the current is switched off. Also the battery voltage and the negative voltage at the source node influence the time that is needed to completely switch off the DMOS transistor. The bigger this negative voltage is, the faster the transistor can be turned off.

As the battery voltage, the inductance and the resistor of the load cannot be influenced, $V_S$neg is the only parameter that can be used to minimize the time of the switch-off. For applications where both HSD and LSD are needed, it is wanted to have the same switching times.

At the time when the transistor finally turns off the gate-source voltage $V_{GS}$ is equal to the threshold voltage. Thus $V_S$neg=$V_G$neg−$V_{Th}$. The output impedance of the driving circuit can be neglected. If it is designed well, only a leakage current is flowing from the gate to the driving circuit. Thus the output impedance will be much higher than the gate-source resistance. As both are switched in parallel, only the $R_{GS}$ is important.

The parameters of the DMOS cannot be influenced. But RGS is a free design variable and can be adjusted, depending on the loads the circuit is designed for. Knowing the values of the load, $R_{GS}$ could be chosen in that way, that the maximum voltage ratings of the DMOS are not exceeded and no further protection for the transistor is needed. However this would only work for one specific load, and also variations in the battery voltage would be challenge if no additional measures are taken to protect the circuit.

With the mechanism of the transistor opening itself, as the source voltage is dropping, it is self-protected against a destruction just by switching off the current. This is a major difference to the LSD. However the critical maximum voltage ratings may be exceeded, such as the maximum gate-source voltage and the maximum drain-source voltage. The first one for the used DMOS transistor is for example 12V. The gate-source voltage drops from the calculated $Vs(t_1)$ of 1.995V down to $V_{GS}=V_{Th}$. Thus, this limitation is no problem. The maximum allowed drain-source voltage is 50V in this example. As the source voltage will drop to $V_S\text{neg} \approx V_G\text{neg} - V_{Th}$, the drain-source voltage will be $V_{DS}=V_{BAT}-V_S\text{neg}$. With the values of this example this will be 55.27V for $V_{BAT}=14V$ and L=5 mH. If a load dump occurs, $V_{BAT}$ can rise up to 40V. $V_G\text{neg}$ or $V_S\text{neg}$ will not change much, but the maximum $V_{DS}$ will be above 80V. In both cases the DMOS transistor would be destroyed.

To avoid this case, additional measures may be taken to protect the transistor. This can be done by clamping the critical voltages below the maximum allowed voltages for the DMOS.

The HSD and the LSD have been explained. Although consisting of the same basic components, the way they work is different. For the HSD the driving circuit has to be supplied by a voltage higher than battery, which is difficult in a car and, for example, a charge pump is needed. Up to a certain point the HSD protects itself, however to be sure, protection is also needed here. A major disadvantage compared to the LSD is the fact, that source and gate drop to voltages below substrate.

As the DMOS is in an n-well connected to drain this is no problem as long as drain is connected to a positive voltage. This way the negative source and gate are isolated from the rest of the circuit. As the gate may be negative, too, it is important that it is not directly connected to a n-well of any kind. This has to be considered during the design of the HSD. Why is the HSD needed despite of its disadvantages?

In automotive applications, HSD have a long history. Ground in a car is usually the whole body. So a short to GND is much more likely than to the battery. For a LSD the load would be switched on. However, it is self-understood that loads like the valves of the braking system and not even the headlights should turn on in that case. For the HSD a short to GND does not display a problem, The load will be connected with both terminals to GND and therefore is switched off. The complete battery voltage will drop over the DMOS of the HSD. This transistor is able to withstand the voltage, and as long as no gate voltage is applied, no current is flowing. If however the transistor is turned on and the load is shorted, too high currents would flow through the transistor. The currents in this case are much higher than in normal operation, as the battery voltage is dropping across the channel resistance $R_{DS}$on of the DMOS, which is designed to be very low. The DMOS is usually not dimensioned to conduct these currents. Therefore an additional protection is needed for this case.

Another reason to use a HSD are some special applications in which it is needed to have both LSD and HSD. A common automotive application is a motor controlled by a H-bridge configuration, shown in FIG. 3. Such configurations are used, e.g., for automatic gear boxes, clutches, adjusting mirrors, opening and closing windows or seat controls. It is possible to run the motor in two different directions. If the HSD on the top right and the LSD on the lower left are opened, current is flowing from right to left through the motor. When the two other drivers are active, the motor is running in reverse direction. Therefore a device is required that has a switching stage that can be provided with either a low side configuration or a high side configuration.

The invention has been devised with the foregoing in mind. Thus, the invention provides an integrated circuit device for switching electrical loads that can have an inductive component in an automotive application, comprising at least one switch that includes a power stage with a power MOS transistor and a driver circuit for driving the gate of the power MOS transistor, the switching stage being configurable for use in either of a High Side configuration and a Low Side configuration. This means that, if operating requirements change and a high side configuration is required instead of a low side configuration, or vice versa, the circuit does not have to be changed or re-configured.

Preferably, the device comprises a plurality of similar switches, each of which is configurable independent of all other switches. The power MOS transistor when in an OFF condition and in a High Side configuration should ideally have its source allowed to assume a voltage level sufficiently below substrate. This ensures a fast switching off time. Also, the power MOS transistor when in an OFF condition and in a High Side configuration should preferably have its gate uncoupled from the driver circuit and the circuit should preferably be provided with a drain-gate voltage clamp associated with the power MOS transistor. The drain-gate voltage clamp can be formed by a plurality of reverse-biased, series-connected base-emitter junctions of integrated npn structures.

Preferably, the device additionally includes a gate-source voltage clamp associated with the power MOS transistor.

The drive circuit in a High Side configuration should be connected to a supply voltage of a level above a battery supply voltage to which the power MOS transistor is connected. This can be achieved by including a charge pump that provides the supply voltage to the drive circuit.

Preferably, the power MOS transistor is a Lateral Double Diffused MOS transistor and should ideally be of n-channel type.

A complete HS/LS Driver consists of several different components, like a protection for the transistor, diagnostics to detect open load, short circuit or over temperature conditions and a driving circuit that provides an accurate gate voltage to control the transistor.

Figure 4:
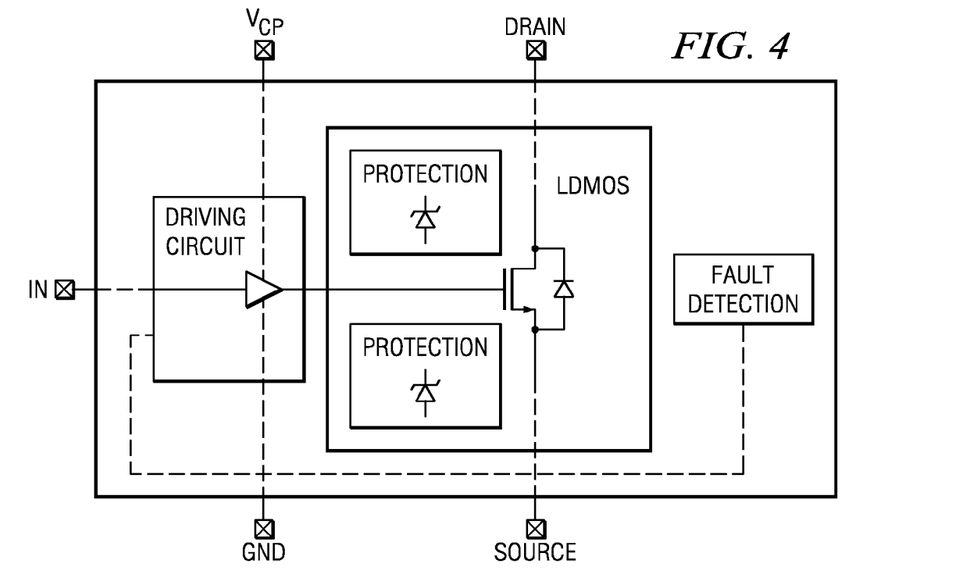
FIG. 4 is a block diagram for an integrated circuit device according to the invention.

The following modules will be implemented, as shown in the block diagram in FIG. 4: LDMOS power transistor; Protection for High-Side and Low-Side application; Driving circuit; Over current detection and Control logic.

As described above, the protection is needed to prevent the LDMOS from getting destroyed, if the load has an inductive component. It is shown in FIG. 4 as a Zener diode from drain to gate and gate to source. The driving circuit is also vital for the function of the chip. It transforms a digital signal or control signal into an accurate gate voltage, which is able to turn the power transistor on or off. This digital signal is formed by a logical input and a fault detection signal. The control logic is integrated in the driving circuit which is supplied by the charge pump circuit and is connected to GND. For the LSD the driving circuit is supplied by a smaller voltage as the maximum gate-source voltage of 12V must not be exceeded. To achieve that, it has to be detected if the DMOS is used as HSD or LSD. According to that, the supply voltage of the driving circuit has to be switched from charge pump voltage to another supply voltage. Depending on the application the DMOS is designed to work just in a specified current range. If the maximum specified current is exceeded the transistor will be destroyed. Therefore a over-current detection (on the right in FIG. 4) is needed to switch off the transistor before the maximum current is reached. In case of failure it generates a logical control signal which is fed back to the driving circuit to switch off the DMOS (more details are explained below).

The Load and its Effect on the High-Side/Low-Side Driver

Figure 5:
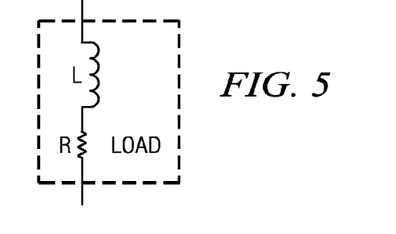
FIG. 5 is an equivalent circuit for a load to be driven by the integrated circuit device according to the invention.

For the configurable HS/LS Driver, the way the external load is connected determines whether it is a HSD or a LSD. But it also influences the switching behaviour of the complete circuit. The load for automotive applications normally has a resistive and an inductive component. Depending on the kind of load, the ratio between resistive and inductive load may vary. For the following simulations, the load is modeled as a resistor and a inductor in series, as shown in FIG. 5. For some applications it might happen that the inductive part is much smaller than the resistive part. In this case nearly no energy is stored in the coil and it is no problem to switch off the current through the load. No voltage peaks will occur and the DMOS can be switched off immediately without the risk of being destroyed. This case occurs only for special loads and displays no problem. Thus the focus will be on loads consisting of inductivities of several mH and a resistive load.

The resistive part determines the current flowing through the load and of course also through the power transistor. The resistance of the transistor should be very small compared to the load resistance as the power should not be dissipated in the switching resistance but in the load itself.

Design of a Protection for a Configurable HS/LS Driver

It is the preferred method to use a gate-drain protection with an additional reverse biased diode. The goal is to avoid in the case of a switch-off that the maximum voltage ratings are exceeded. However it is desired to get close to these maximum voltages in order to be able to switch off the power transistor as fast as possible, Zener Diodes for Configurable HS/LS Drivers In typical technologies, different Zener diodes with different breakthrough voltages, for example 5.8V and 11.6V, are available. They are built by using NPN transistors and shorting either collector and emitter or base and collector. A gate-drain clamp with these Zener diodes would work perfectly for a LSD. However in the case when the configurable driver is used as HSD, these diodes have a disadvantage. In a HSD it is desired to achieve negative voltages at source and gate. If the diodes with shorted collectors and bases are used, the collector n-tank of the NPN transistor is connected to the negative gate node, leading to a current into the substrate, as the substrate diode is forward biased, Although the current flowing into the substrate is much smaller than in the case when the power transistor is injecting current, parasitic npn transistors could be turned on and a latch-up might occur. Of course, guard-rings could be used to avoid any effect on other parts of the circuit. But this leads to an increase in the needed die size. But even worse, a normal operation of the Zener diodes is not possible, because the substrate diode is forward biased before the breakthrough voltage is reached.

Then the drain is connected to the battery voltage, the source to the load. When the transistor is switched off, the source voltage becomes negative and via capacitive coupling the gate gets negative, too. If the gate drops below ≈0.7V the substrate diode of the Zener diode is forward biased and clamps the gate voltage to $V_G = V_{SUB} - V_{BE} \approx -0.7V$. Beyond that voltage the current would flow through the substrate diode and not through the Zener diode itself and thus not leading to the wanted voltage drop across the Zener diode. Also for the Zener diodes with shorted collector and emitter a normal operation in the HS configuration is not possible, although here the collector of the diode is not connected to the gate. But when the gate voltage is dropping too far into negative regions, again the substrate diode is forward biased.

Due to the available Zener diodes several diodes in series are needed to achieve a high clamping voltage in the range of 40-50V. When the HSD is switched off again the source and gate get negative. But now the gate voltage is clamped to $V_G = V_{SUB} - V_{BV} - V_{BE}$. This is better than the clamping with Zener diodes with shorted collector and base. Using a Zener diode with a breakthrough voltage of 11.6V, the gate could drop to −12.3V. For a normal battery voltage of 14V (when no load dump occurs), this would result in a clamping voltage of 26.3V. But the desired drain to gate clamping voltage of −40 to −50V will not be reached.

Such low clamping voltages would avoid the destruction of the device, but a fast switch-off is not possible. Further the switching times change depending whether the configurable HS/LS driver is in HS or LS configuration and on the supply voltage in the HS configuration. To achieve fast and constant switching times and to avoid parasitic NPN transistor activities a clamping is needed which avoids any substrate currents and provides a clamping that is referred to the drain voltage.

So the common Zener diodes cannot be used, but they can be modified. The diodes with shorted collector and base just use the base-emitter breakdown to provide the clamping voltage, while the n-well of the collector is not so important. As this is the well that forms the substrate diode, the solution is to use just the base-emitter diode and to assure that the collector-substrate diode is never forward biased. This way Zener diodes were created. In these diodes the short between collector and emitter was removed. Now the Zener diode is a three terminal device, in fact without that short it is a npn transistor again. However only the base-emitter diode of this transistor will be used in reverse bias. The collector is connected to a voltage higher than that of the substrate to assure the substrate diode is not forward biased in any case.

As neither the dimensions nor the doping profiles of the Zener diodes have changed, the breakthrough voltage of the new diode is exactly the same as in the old one. Thus, diodes with a breakthrough voltage of for example $V_{BV} = 5.8V$ and $V_{BV} = 11.6V$ are available.

However, the maximum voltage ratings of the technology do not allow the collector to be connected to just any high voltage. The easiest would be to connect it to the drain voltage. But with the used technology the thermal collector-base breakdown voltage is specified as 46V for the 11.6V diodes, even less for the 5.8V diodes. In a HSD the drain is connected to the battery voltage. In case of a load dump the battery voltage will be 40V. In the case of switch-off it is wanted to allow a high drain source voltage to turn the transistor off as fast as possible. 46V is close to the load dump voltage and it would be too risky to connect the collector of the Zener diodes to drain, as the Zener diodes could get destroyed then. The protection of the LDMOS should be more robust than the LDMOS itself.

So it has to be connected to a positive voltage and the maximum collector base voltage may not be exceeded. However, the collector voltage may not influence the clamping behaviour. But the effect of the collector voltage on the behaviour of the Zener diode is negligible, as the breakthrough voltage is $$V_{BV}=(\in(N_A+N_D)/2qN_AN_D)E^2\text{crit},$$

where Ecrit is the critical electrical field at which the carriers traversing the depletion region acquire sufficient energy to create new electron-hole pairs in collisions with silicon atoms. The value of this critical field is dependent on doping density. Thus the collector voltage has no effect on VBV and just the current flowing is slightly influenced by the collector voltage. The diode current of the Zener diode is the base current in the used npn transistor. The collector current is only influenced by the Early effect, The base current is $$I_B=I_C/\beta$$

and thus the effect of the collector voltage on the base current is very small.

Voltage Clamping for Configurable HS/LS Drivers

To avoid the destruction of the LDMOS, a clamp between the gate and the drain is necessary. The clamping voltage should be as high as possible to allow a fast switch-off of the transistor, but must not exceed the maximum voltage ratings of the LDMOS. The clamping voltage has to be designed in a way, that the following equation is fulfilled:

$$V_{DS}\text{max}\geq V_{GS}+V_{BV}+V_f$$

Thus, the clamping voltage $V_{BV}$ should be less than the maximum drain source voltage minus the gate-source voltage in the operating point. But it has to be higher than 40V, as a normal operation during a load dump has to be guaranteed. On the other hand, the maximum drain-source voltage of 50V should never be reached.

Figure 6:
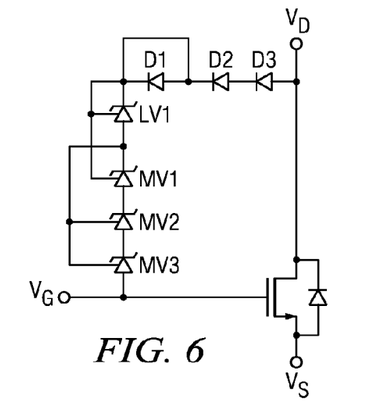
FIG. 6 is a circuit diagram of a gate-drain voltage clamp for use with the integrated circuit device according to the invention.

So, the clamping voltage should be between 40V and 50V. As for example 5.8V and 11.6V Zener diodes are available, several of them in series have to be used. FIG. 6 shows the used gate-drain voltage clamp for the chip. For the Zener diodes the modified versions of diodes are used that have an extra pin for the connection of the collector, as introduced in the previous section.

Three 11.6V Zener diodes (marked with MV) are arranged in series with one 5.8V Zener diode (marked with LV). In addition three pn-junction diodes are also placed, marked with D. The Vhigh pins of LV1 and MV1 are connected to the Minus pin of LV1, to isolate the Zener diodes in case of negative voltages at the gate. The maximum possible collector-base voltage is 5.8V in LV1 and 17.4V for MV1, therefore the maximum allowed collector-base voltage is not exceeded. Vhigh for MV2 and MV3 are connected to the node between LV1 and MV1. Thus the maximum possible collector base voltage for MV3 is 34.8V. The node between LV1 and MV1 drops to $V_{BAT}-2\times V_f-V_{Z,LV1}$ in the case of switch-off. When the battery voltage is 14V this node can drop down to 6.8V, and, hence, stays above 0V as required according to the previous section.

The advantage of using three pn-junction diodes is, that they have a negative temperature coefficient. Thus they can counterbalance some of the temperature behavior of the Zener diodes and help to achieve a clamping voltage that is not exceeding the maximum ratings at any temperature. Additionally in the case of clamping current is flowing through these diodes and a voltage of roughly 0.7V drops across each of them. Thereby the clamping voltage can be adjusted more precisely than just with 5.8V or 11.6V Zener diodes. D1 is shorted and can be used as spare part to tune the clamping voltage or the temperature coefficient. This can be done by a metal change, as in the layout D1 is shorted in a way that allows to undo the short by removing a small part of the highest metal layer.

Also D2 is connected in a similar way so that it can be shorted after processing. Thus the clamping voltage can be tuned by +/−0.7V.

With the used example configuration, the clamping voltage at room temperature is $$V\text{clamp}=3\times 11.6V+5.8V+2\times 0.7V=42V.$$

Thus, the clamping voltage is within the specified region of 40-50V.

In the case of a load dump it can be assumed that the battery voltage is 40V. Thus the charge pump voltage has to be higher than the battery voltage. For the simulations the charge pump voltage was 10V higher than the battery voltage, in this case 50V. Now the drain of the DMOS is connected to 40V, thus the gate and the source node cannot drop that far into negative regions before the clamping voltage is reached.

When a digital high signal is applied at the input of the driving circuit, the gate is charged. As the driving circuit is now supplied with $Vc_P$=50V, and the gate is loaded to nearly 50V. With a gate voltage more than the threshold voltage higher than the source, the transistor turns on and the source voltage is then 38.97V≈$V_{BAT}$. When the input signal is low, the gate voltage will be 0V. Now the source and the gate start to drop into negative regions until the gate-drain clamping voltage is reached. The gate reaches its most negative point at −6.47V, resulting in a maximum clamping voltage of 46.47V, which is comparable to the clamping voltage for the HSD with $V_{BAT}$=14V. The most negative value of the source voltage is −8.634V. Thus the maximum drain-source voltage is 48.63V and the breakdown voltage of 50V is not reached.

The introduced gate-drain clamping is an effective protection for the HSD. The maximum drain source voltage is not exceeded. Also the transistor may need to be protected against a gate-source breakthrough. During normal operation the maximum gate-source voltage of 12V is never reached.

Figure 7:
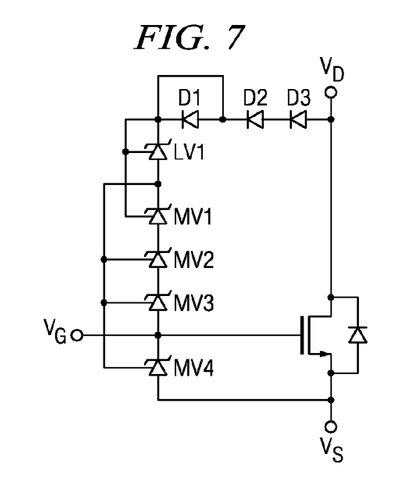
FIG. 7 is a circuit diagram of a gate-drain voltage clamp with additional gate-source protection for use with the integrated circuit device according to the invention.

But in case of a ESD strike a gate-source clamp can protect the LDMOS. A clamping structure with an additional 11.6V Zener diode between gate and source is shown in FIG. 7.

For the LSD the gate-drain clamp can also be used. When no current is flowing through the LSD, the drain voltage is equal to the supply voltage. If the transistor is turned on by a digital input signal, the drain node is nearly equal to ground, as the drop across the DMOS is negligible. The driving circuit is supplied with 10V, thus the gate can be charged to 9.84V. When the input signal is low again, the transistor is turned off. Now the inductance causes a voltage drop, leading to high voltages at the drain.

With the proposed clamping, the maximum drain-source voltage is still not exceeded, both for the HSD and LSD.

With a gate-drain clamping the source voltage is just dependent on the drain voltage and the clamping used, and is independent of the substrate voltage. Thus huge negative voltages can occur. An alternative is to limit the maximum negative source voltage in relation to the substrate voltage. For the HSD the theoretical limit of the negative voltage for a gate-drain clamp at the source is VBAT−VDSmax (−36V for $V_{BAT}$=14V or −10V for $V_{BAT}$=40V).

Figure 8:
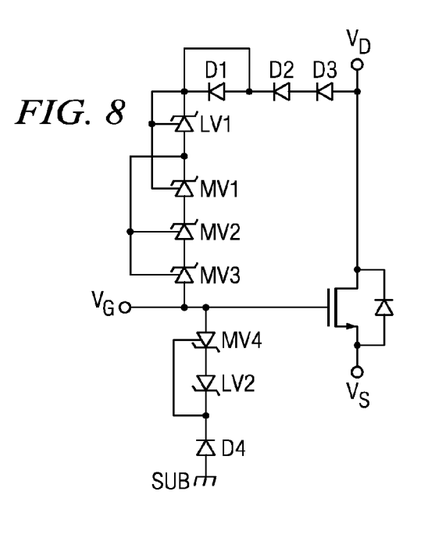
FIG. 8 is a circuit diagram of a gate-drain voltage clamp with additional gate to ground clamp for use with the integrated circuit device according to the invention.

An additional possibility of clamping the voltage is shown in FIG. 8. The gate is clamped to ground by using a Zener diode and a pn-junction diode. In this case a low voltage and a medium voltage Zener diode are placed in series. The pn junction diode has to be put into the clamping path to guarantee normal operation. Otherwise when the gate is charged the Zener diodes would be forward biased and the gate voltage could never reach the threshold voltage of the LDMOS to turn the transistor on. With the shown configuration in FIG. 8 the gate is not able to drop below $-(V_{LV2}-V_{MV4}-V_{Dio,D4})=-18.1V$. However, the gate-drain clamping is still needed. If a load dump occurs, the battery voltage will be 40V, if the gate is dropping to $-18.1V$, the gate-drain voltage is 58.1V and is exceeding the maximum drain-gate voltage. As the source is 2-3V lower than the gate, the maximum drain-source voltage would be exceeded too.

Design Constraints and Dimensioning of the DMOS Transistor

To achieve a low $R_{DS}$on, the ratio of channel width W to channel length L has to be increased. As the length is given by technology parameters only the width can be influenced. This width cannot be increased infinitely, as the current distribution over the whole width would not be equal. Another possibility to achieve a big width is to build the transistor with several fingers. The source-well is a self-adjusting process controlled by the window in the gate-poly. As this poly is at both sides of the source, current can flow into both directions. The drain contacts are on the opposite side of the poly.

Thus two transistors that are switched in parallel are formed and the ratio of w/L is doubled. Thus LDMOS transistors form a double transistor due to their layout.

To generate a configurable HS/LS Driver both source and drain have to be accessible from outside. Therefore they have to be connected to external pins of the chip. The DMOS transistors display a challenge in the protection of other parts of the circuit when the drain is connected to a negative voltage. To avoid any problems three guard rings are placed around each LDMOS, the first one connected to ground, the other two connected to the battery voltage. To improve the behavior, substrate contacts are placed between the guard rings.

A highly doped buried layer contacted by deep N-wells is placed under the LDMOS to reduce parasitic resistances and decrease latch-up effects.

The driving circuit is charging and discharging the gate, After the switching, the driving circuit is not providing any current, leaving the gate node floating. If the gate is loaded via capacitive coupling the transistor could be switched on. To avoid such an unwanted turn on, a resistor is placed between gate and source to allow any charges on the gate to flow to source and thus unload the gate. However during normal operation the gate current of a MOS transistor should be zero.

If the gate and source drop to high negative values, these voltages enable fast switching times for the HSD. Due to the modified Zener diodes and the driving circuit, no difficulties emerge due to the negative voltages.

The Driving Circuit

The driving circuit has the task to provide a valid gate voltage to control the configurable HS/LS Driver properly. For a HSD it takes a gate voltage higher than the battery voltage to open the LDMOS transistor, For a LSD the maximum gate voltage just has to be high enough over ground level to open the LDMOS so that enough current can flow through it. Whether the output of the driving circuit provides a voltage higher than the battery or just a voltage several Volts above ground is determined by the supply voltage. This can be provided on or off the chip. From now on the supply voltage of the driving circuit will be called $V_{CP}$ to clarify the difference from the battery voltage, that supplies the rest of the circuit.

Figure 9:
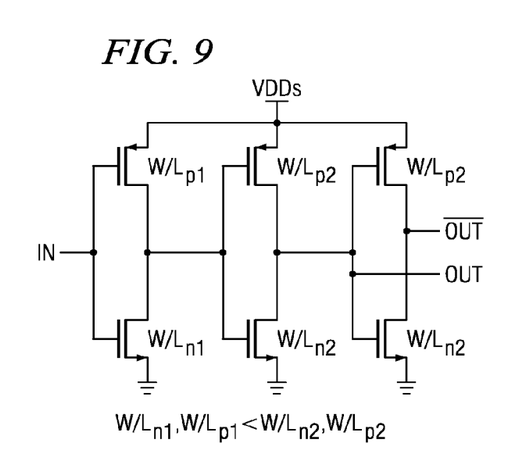
FIG. 9 is a circuit diagram of the input stage of the driving circuit in the integrated circuit device according to the invention.

For the driving circuit, several realizations exist. One of these is explained in more detail in the following. The driving circuit is built by several components. The first one is the input stage. Its basic configuration is shown in FIG. 9. It consists of three inverters in series that are supplied by 5V.

The input is a 5V digital control signal. As this input stage has to drive bigger loads than digital circuits, the ratio of w/L of the first inverter is minimal, but the ratio of the following inverters is higher to provide a larger loading current. This way a capacitive load which is bigger than the capacity of the inverters can be loaded without any problems. The input stage shown creates a differential output signal which can be used to control a latching circuit.

Figure 10:
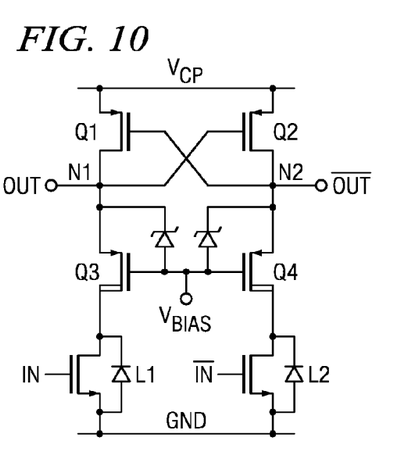
FIG. 10 is a circuit diagram of a latching circuit of the driving circuit in the integrated circuit device according to the invention.

The second part of the driving circuit is a latching circuit (shown in FIG. 10). It is controlled by the outputs of the input stage and is supplied by $V_{CP}$. The inputs are the gates of the transistors L1 and L2. The actual latching circuit are the cross coupled transistors Q1 and Q2. As mentioned earlier LDMOS transistors show a non-ideal behaviour in their output and transfer characteristics. They are also bigger than usual CMOS transistors, resulting in a higher capacitance. To make a fast and precise latching possible, CMOS transistors with a maximum drain-source voltage of 8V are used for Q1 and Q2. As $V_{CP}$ can be above 50V in the HSD, the maximum drain-source voltage of the CMOS transistors would be exceeded. Q3 and Q4 are used to protect Q1 and Q2. Asymmetrical drain-extended PMOS transistors with a maximum drain-source voltage of 60V are used for Q3 and Q4. They are biased with a voltage VBIAS which should be smaller than $$V_{BIAS}\text{max}=V_{CP}-(8V+V_{SGQ3/4})$$

For the chip, the bias voltage is 7V below $V_{CP}$. Thus the drain-source voltage of Q1 and Q2 never exceeds 7V and they are operated safely. The Zener diodes between the gates and the sources of Q3 and Q4 prevent a breakthrough due to too high voltages. As the nodes N1 and N2 never drop under 7V below $V_{CP}$, the rest of the supply voltage drops either across the transistors L1 and L2 or Q3 and Q4, depending on the state of the circuit. Therefore the maximum drain-source voltages of these transistors have to be above 50V. As already mentioned, this is not a problem for Q3 and Q4. For L1 and L2 50V LDMOS transistors are used so that all transistors in this latching circuit can work in the safe operating area.

If the voltage at the gate of L1 is at high logic level, L1 is turned on, conducting a current which causes the voltage at node N1 to drop. This results in turning on Q2 and the voltage at node N2 rises to nearly $V_{CP}$. Thus Q1 is turned off, ensuring the voltage at N1 to drop to $V_{BIAS}+V_{GSQ3}$. If the voltage at the gate of L1 is low, the gate voltage of L2 is high and the latching circuit works analogous. Another part of the driving circuit will provide the current to charge or discharge the gate and the bias voltages.

This current is responsible for the slope of the gate voltage. If the slope is too steep, the LDMOS will turn on or off very fast and electro-magnetic radiation will be produced in a frequency range that might affect other electronic parts in the car. Secondly this current also influences the current through the clamping. Due to parasitic resistances in the clamping, too much current changes the clamping voltage. Because of these two reasons the current charging or discharging the gate should be controllable by a reference current.

Figure 11:
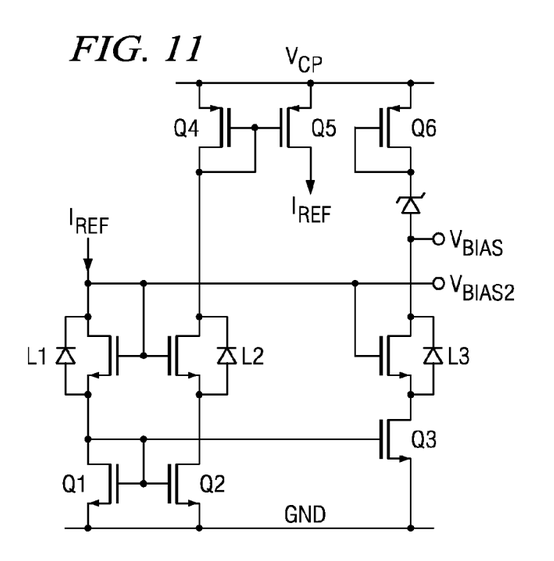
FIG. 11 is a circuit diagram of a bias-circuit of the driving circuit in the integrated circuit device according to the invention.

In FIG. 11 the used bias-circuit is shown. For the chip $I_{REF}$ is connected externally. The transistors L1, L2 and L3 are 50V LDMOS transistors. To improve the accuracy and matching, all other transistors are 8V CMOS transistors. The reference current is fed into a cascaded current mirror formed by the transistors L1 and L2, and Q1 and Q2. As the same current as the reference current should flow into L2, L2 and Q2 are dimensioned equally as L1 and Q1. Q4 and Q5 are used to mirror the reference current again. The current flowing out of Q5 can be used in other parts of the circuit.

The cascaded configuration is used to improve the performance of the mirror. However it is also necessary to protect Q2. As the driving circuit is supplied with $V_{CP}$, the maximum drain-source voltage of Q2 would be exceeded for supply voltages higher than about 8-9V. With L2 the drain voltage of Q2 will not be higher than approximately the drain voltage of Q1, assuming that the gate-source voltage of both Q1 and Q2 are equal.

The bias voltage $V_{BIAS}$ for the latching circuit is generated by the transistors Q3, Q6 and L3 and a Zener diode. The current flowing through the Zener diode is controlled by a cascaded current mirror of Q1, Q3, L1 and L3. As this current does not have to be very large, the ratio w/L of Q3 and L3 respectively is much smaller than those of Q1 and L1. As the Zener diode is built in reversely the current causes a constant voltage drop of the specified Zener voltage. To raise the bias voltage, Q6 is added in diode configuration, thus the bias voltage is $V_{BIAS}=V_{CP}-Vf-Vz$. With the used elements the bias voltage is 6.99V below the supply voltage.

Furthermore the gate voltage of the LDMOS transistors is used as a second bias voltage $V_{BIAS2}$ which is used in the output stage of the driving circuit.

Figure 12A:
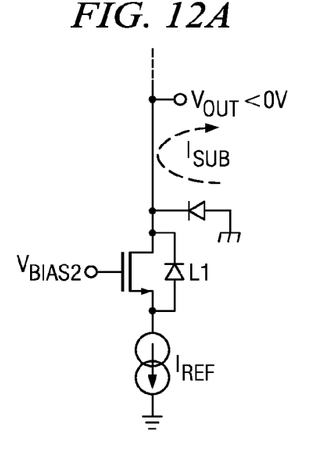
FIGS. 12A-C are circuit diagrams of different current sink options for the integrated circuit device according to the invention.
Figure 12B:
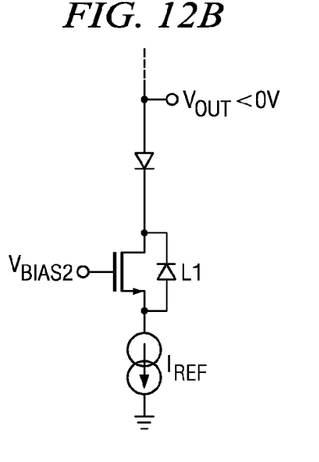
Figure 12C:
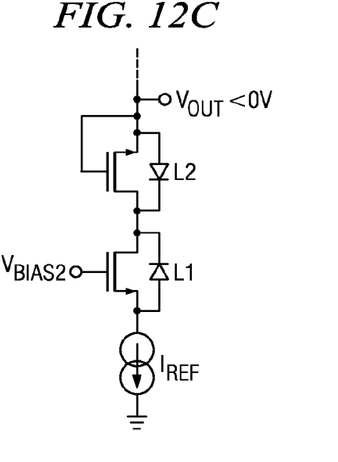

Another important part of the driving circuit is the output stage. Its output is connected to the gate of the LDMOS. As already mentioned earlier the gate of the LDMOS can be negative in a HSD. Then no n-well may be connected to that gate. Thus a normal push-pull stage would cause a problem. The output stage of the chip uses a different push-pull stage. However to get precise currents the current sources are built of 8V CMOS transistors. To protect them against exceeding their voltage ratings, a drain extended 66V PMOS and a 50V LDMOS are used as switching transistors. The drain extended PMOS is thus connected with its drain to the output. As the drain is isolated in this transistor by an n-well on a higher potential, no substrate diodes are forward biased when the output of the stage is connected to a negative voltage. However the drain of the LDMOS is also connected to the output. The drain of a LDMOS is an n-well which is not isolated from the substrate. Thus if the drain is connected to negative voltages the diode between this n-well and the substrate is forward biased, leading to the disadvantages mentioned above. This case is shown in FIG. 12A. To avoid that, a diode can be inserted between the output and the LDMOS as shown in FIG. 12B. Here no current can flow from the substrate over drain well of the LDMOS to the output. If the gate voltage is positive, the diode is forward biased and the push-pull stage can work normally. In the chip a LDMOS is used as diode, shown in FIG. 12C. Source and gate are shorted, thus the transistor does not turn on. However if the source voltage is about 0.7V higher than the drain voltage, the pn junction between the p-well and the n-well of the LDMOS gets forward biased.

Figure 14:
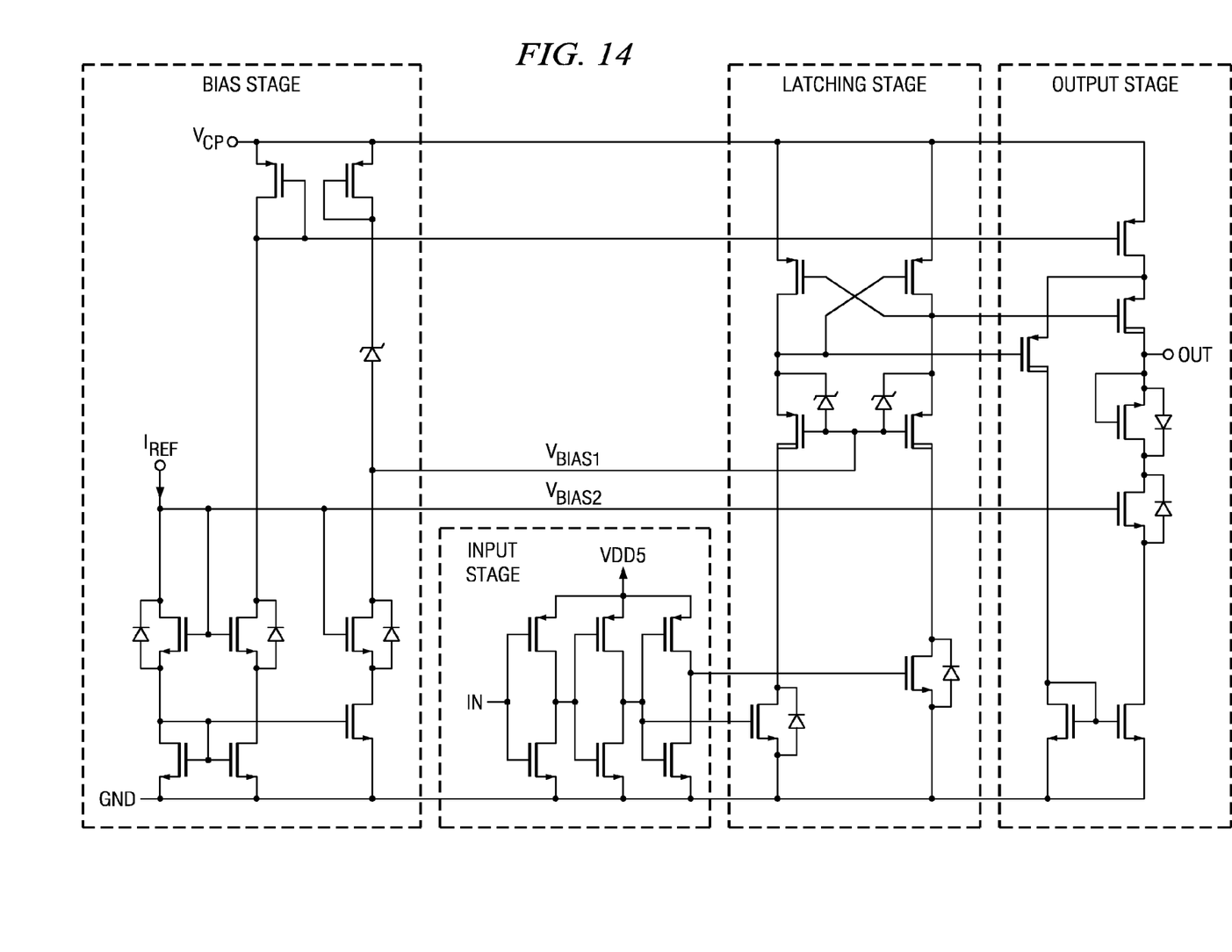
FIG. 14 is a circuit diagram of the complete driving circuit in the integrated circuit device according to the invention.

The complete structure of the output stage is shown in FIG. 14. Transistors Q1 and Q5 are the current mirror transistors mentioned in the bias circuit used to mirror the reference current into the output stage. The drain extended 66V PMOS transistors D1 and D2 are used to switch the reference current either into the right or left current path, depending on the differential output of the latching circuit. Q2 and Q3 are 8V CMOS transistors used to mirror the reference current and thus used to unload the gate. The LDMOS transistor L1 protects Q3 and is biased with the voltage $V_{BIAS2}$ generated in the bias circuit.

With a proper dimensioning the gate can be loaded with the reference current nearly up to $V_{CP}$. To achieve that, the ratio of w/t. of D2 and Q5 have to be large enough that the drain-source voltage of both transistors are small compared to $V_{CP}$.

Figure 13:
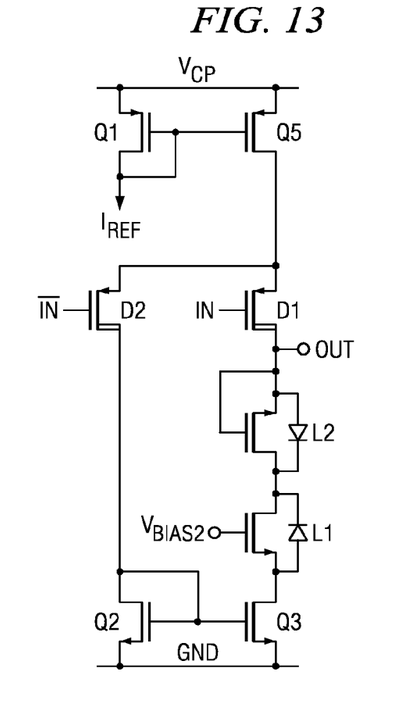
FIG. 13 is a circuit diagram of the output stage of the integrated circuit device according to the invention.

An additional requirement of the output stage is that the gate remains floating after it is discharged. This is needed as, for the HSD, the gate voltage should be able to drop to negative values. If the output voltage is kept at ground voltage, this is not possible and the HSD can not be switched off fast. A floating output is only needed for the case when the gate gets negative, The circuit shown in FIG. 13 discharges the gate as long as it is positive, as the current mirror formed by Q2 and Q3 is pulling current from the gate. However if the gate voltage is zero, the drain-source voltage is zero and Q3 is in an operating point where $V_{GS} \geq V_{Th}$, but no current except the leakage current is flowing. As the leakage current is negligible no current is flowing to keep the gate at ground. When the gate is negative Q3 is not able to conduct any current. Additionally the diode formed by L2 is reverse biased and keeps the gate floating.

In FIG. 14 the complete driving circuit is shown which is built with the above mentioned stages.

It is important to dimension the transistors used for mirroring the reference current in a way, that they work for all supply voltages from 4V up to 56V. Especially for conducting 1 mA theses transistors have to be wide enough. Otherwise they would cause a large drain-source voltage drop and it is not possible to load the output voltage nearly up to $V_{CP}$. Additionally for 4V supply voltage the current mirrors might not be in the correct operating point as the needed drain-source voltages would be in sum higher than the supply voltage. Thus the transistors would not be in saturation which leads to an unwanted dependency of the mirrored current on the drain-source voltage.

The time to load or unload the gate is dependent on the reference current. With higher currents the gate is loaded faster. Thus the slope can be controlled effectively over the reference current. In Table 1 the different slopes for the simulated reference currents are listed, showing, that it is easily possible to adjust the slope of the output voltage. As expected, the slope is proportional to the reference current.

TABLE I

| $I_{REF}$ | Slope of Output |
|---|---|
| 1 mA | 19.06 V/us |
| 500 uA | 11.28 V/us |
| 150 uA | 3.47 V/us |
| 50 uA | 1.01 V/us |
| 15 uA | 0.33 V/us |

Over-Current Detection and Control Logic

Figure 15:
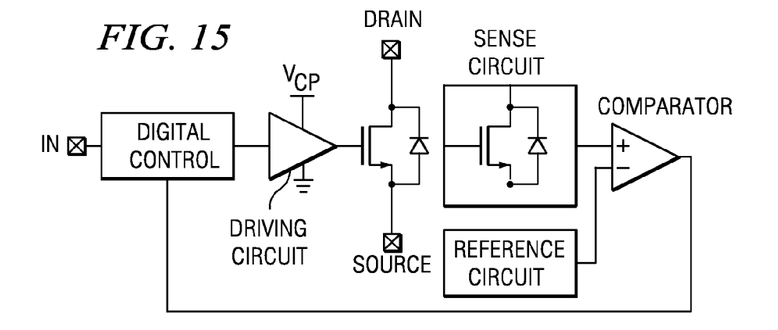
FIG. 15 is a circuit diagram of the over-current protection circuit in the integrated circuit device according to the invention.

As already mentioned earlier the maximum current is basically determined by the battery voltage and the resistive part of the load. However if the load is shorted or has a too small resistive fraction, currents occur which destroy the LDMOS. To avoid that the chip is destroyed due to wrong handling, a protection against these cases was implemented. One basic principle of this protection is shown in FIG. 15 and is explained below, however other principles are possible, Here the different components are shown. A sense circuit outputs a signal proportional to the current flowing through the LDMOS. A reference circuit creates a reference signal. Both these signals are connected to a comparator. When the sense signal reaches the level of the reference signal, the comparator creates a digital high signal, which is fed back to a digital control circuit. In this circuit the signal of the comparator and the input signal is processed. Only if the comparator signal is low and the input is high, it generates a digital high signal, which is connected to the driving circuit. Then the driving circuit turns on the LDMOS.

Over-Current Sensing and Reference circuit

Figure 16:
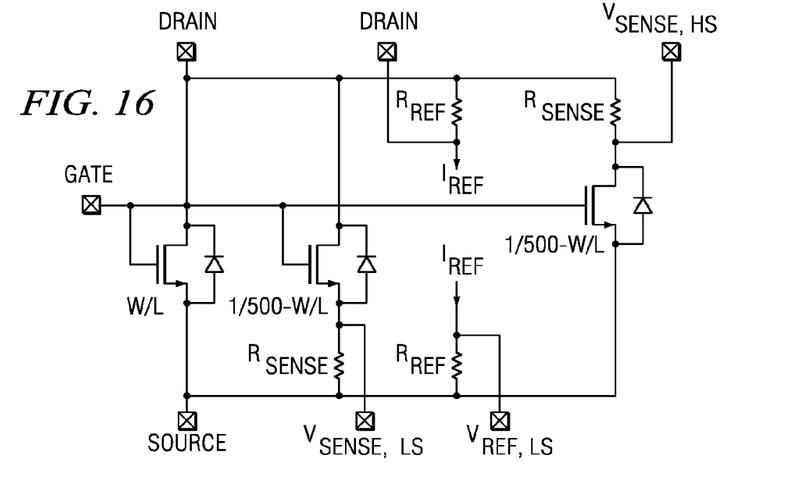
FIG. 16 is a circuit diagram of the sense and reference circuit in the integrated circuit device according to the invention.

The first component is the current sensing circuit. Its task is to create a voltage which is proportional to the current flowing through the LDMOS. The basic circuit is shown in FIG. 16. To create this signal two LDMOS transistors are placed next to the LDMOS which is conducting the main current.

The gates of these transistors are connected to the gate of the power LDMOS. The current through the sense LDMOS transistors has to be much smaller to avoid additional losses and to avoid a change in the current to be sensed. Therefore the W/L ratio of these transistors is smaller by a factor of 500.

For the high-side configuration the source of one sensing transistor is connected to the source of the actual LDMOS. Between the drains of the sensing transistor and the LDMOS is a sense resistor. The current through the sensing transistor, which is proportional to the main current, causes a voltage drop across the sense resistor proportional to the current. The system is designed to create a sense voltage $Vsense,_{HS} \approx 100$ mV.

For the low-side configuration the other sensing transistor is connected with its drain to the drain of the power LDMOS. Between the two sources a sense resistor to generate a sense voltage $Vsense,_{LS} \approx 100$ mV.

Additionally two reference voltages $Vref,_{HS}$ and $Vref,_{LS}$ are created by conducting a reference current across a reference resistor. By changing the current or the resistance the level of the reference voltage can be changed. These reference voltages will be used to determine whether or not the current through the main transistor is too high. To achieve a precise behaviour both the transistors and the resistors have to match. As the channel length L of the LDMOS transistors is fixed, the matching of the transistors cannot be influenced by the ratio of W/L. Thus the sensing transistors have to be placed right next to the power LDMOS, to avoid parameter variations due to local process variations. For the resistors a good matching can be achieved by the way, they are built. The preferred method is to use smaller, standardized resistors which are connected according to the resistive values needed. For a good matching the small resistors of the sense and the reference resistor are placed alternating next to each other. In this way process variations are affecting both resistors in the same way.

Comparators for Over-current Detection

The sense voltage and the reference voltage are used as inputs of a comparator. This switches its output to a high voltage as soon as the input voltage is rising above the voltage of the reference input.

Two different comparators are needed, one which can compare close to the battery voltage and another one which compares close to ground. Both should create output voltages of either 0V or 5V, so that the output can be used as feedback to a digital circuit using 5V logic.

Control Logic

The control logic generates the digital signal that is used as input signal for the driving circuit. The output should be equal to the input of the control logic, except when the current through the LDMOS is too high. Then the transistor is turned off. The easiest way is to connect the over-current signal generated by the comparators and the input signal via an AND gate with one negated input. Then the output is high when the over-current signal is low and the input is high. However in case of overcurrent (e.g., due to a short) the output of the logic would be low and the transistor is turned off. Thus there is no more over-current and the over-current signal is low again. When the input is still high, the transistor turns on again. As it is likely that the short is still there, the current through the LDMOS is too high again, leading to an oscillation due to the feedback of the over-current signal.

To avoid this, a slightly more advanced control logic is needed. It is wanted that the LDMOS remains turned off after an over-current occurred, until the input is switched on again. Thus the possibility is given to correct the reason for the over current.

Figure 17:
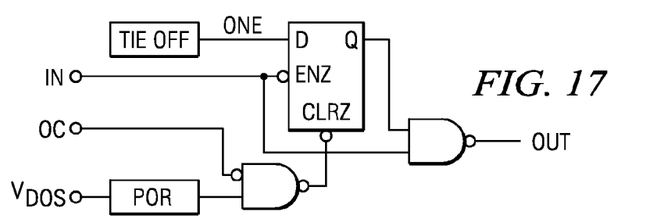
FIG. 17 is a circuit diagram of the digital control circuit in the integrated circuit device according to the invention.

Therefore a D-flip-flop is used. its input is connected via a tie-off cell to logical one. it has an negated enable and clear input. The neglected enable input is directly connected to the input signal. The negated clear signal is generated using an and-linked negated over-current signal and a POR signal. POR stands for power-onreset. This cell generates a logical one only when the full supply voltage is connected to its input. It is needed to avoid false operation, when the supply voltages are ramped up in the beginning. The output of the flip-flop is connected with the input signal via an AND gate, creating the output signal of the digital control circuit. The circuit is shown in FIG. 17.

Figure 18:
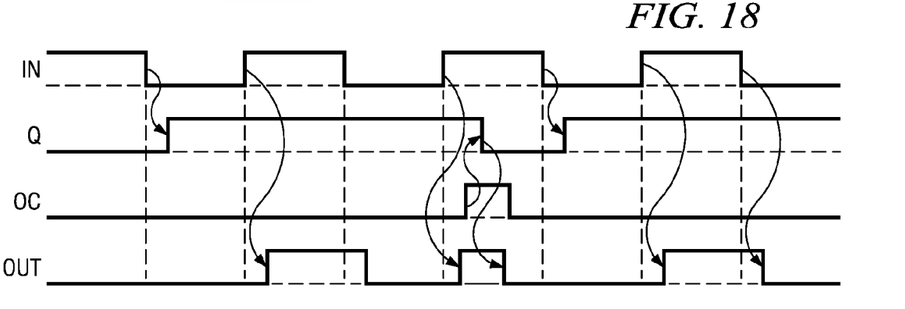
FIG. 18 is a schematic diagram of the digital control signals for the integrated circuit device according to the invention.

FIG. 18 shows the signals of the circuit. After the first high input signal the flip-flop is set to a high output. From there on, the output of the circuit follows the input signal with a small delay. However if the comparator generates a high over-current signal, the flip-flop is cleared, the output of it is low and the output of the whole circuit is low. Thus the LDMOS would be turned off. The output cannot become high again unless the input is switched off and on again. Therefore no oscillations can occur.

Configurations of the Configurable HS/LS Driver for the Chip

Different versions of the HS/LS Driver are possible. The first version has just a gate-drain clamp. This should be sufficient for the protection of the DMOS. However for a later product the driver has to be protected against ESD strikes. Therefore the second version additionally has a gate-source clamping. The third version has a gate-source, gate-drain clamp and an additional clamp, By using a gate to ground clamp, the most negative value of the gate and source is limited to less than 20V.

Although the invention has been described with reference to specific example embodiments, it is not limited to this embodiment and further embodiments and alternatives within the scope of the claimed invention will occur to those skilled in the art to which the invention relates.

What is claimed is:

1. An integrated circuit device for switching electrical loads that can have an inductive component in an automotive application, comprising at least one switch that includes a power stage with a power MOS transistor and a driver circuit for driving the gate of the power MOS transistor, the switch being configurable for use in either of a High Side configuration and a Low Side configuration wherein the power MOS transistor when in an OFF condition and in a High Side configuration has its source allowed to assume a voltage level sufficiently below substrate to ensure fast switching off by a drain-gate voltage clamp formed by a plurality of reverse-biased, series-connected base-emitter junctions of integrated npn structures, formed in an n-well connected to a higher potential so that a parasitic diode to the substrate is not forward-biased.

2. The integrated circuit device according to claim 1, and comprising a plurality of similar switches each of which is configurable independent of all other switches.

3. The integrated circuit device according to claim 1, wherein the power MOS transistor when in an OFF condition and in a High Side configuration has its source allowed to assume a voltage level sufficiently below substrate to ensure fast switching off.

4. The integrated circuit device according to claim 1, wherein the power MOS transistor has its gate uncoupled from the driver circuit and does not have a parasitic diode to the substrate.

5. The integrated circuit device according to claim 4, wherein the drain-gate voltage clamp is formed by a plurality of reverse-biased, series-connected base-emitter junctions of integrated npn structures.

6. The integrated circuit device according to claim 4, and additionally including a gate-source voltage clamp associated with the power MOS transistor.

7. The integrated circuit device according to claim 1, wherein the drive circuit in a High Side configuration is connected to a supply voltage of a level above a battery supply voltage to which the power MOS transistor is connected.

8. The integrated circuit device according to claim 7, and including a charge pump that provides the supply voltage to the drive circuit.

9. The integrated circuit device according to claim 1, wherein the driver circuit in a Low Side configuration is connected to a supply voltage of a level between ground and a battery voltage.

10. The integrated circuit device according to claim 1, wherein the power MOS transistor is a Lateral Double Diffused MOS transistor.

11. The integrated circuit device according to claim 10, wherein the power MOS transistor is of p-channel type.

* * * * *

UNITED STATES PATENT AND TRADEMARK OFFICE
CERTIFICATE OF CORRECTION

PATENT NO. : 7,724,046 B2
APPLICATION NO. : 11/752296
DATED : May 25, 2010
INVENTOR(S) : Michael Wendt, Lenz Thoma and Bernhard Wicht It is certified that error appears in the above-identified patent and that said Letters Patent is hereby corrected as shown below:

On the title page insert item [30]:

-- Foreign Application Priority Data

Jan. 16, 2007  (DE) .................10 2007 002 377.6
May 22, 2006  (DE).................10 2006 024 002.2 --

Signed and Sealed this
Twenty-eighth Day of December, 2010

David J. Kappos
*Director of the United States Patent and Trademark Office*